(12) United States Patent
Feng et al.

(10) Patent No.: US 11,289,926 B2
(45) Date of Patent: Mar. 29, 2022

(54) WIRELESS CHARGER

(71) Applicant: LUXSHARE PRECISION INDUSTRY CO., LTD., Shenzhen (CN)

(72) Inventors: Yun Feng, Hong Kong (CN); Guoqin Huang, Hong Kong (CN); Qijun Yin, Hong Kong (CN); Xu Yao, Hong Kong (CN)

(73) Assignee: LUXSHARE PRECISION INDUSTRY CO., LTD., Guangdong (CN)

( * ) Notice: Subject to any disclaimer, the term of this patent is extended or adjusted under 35 U.S.C. 154(b) by 40 days.

(21) Appl. No.: 16/899,341

(22) Filed: Jun. 11, 2020

(65) Prior Publication Data
US 2021/0281088 A1  Sep. 9, 2021

(30) Foreign Application Priority Data
Mar. 5, 2020  (CN) .......................... 202020259403.9

(51) Int. Cl.
*H02J 7/00* (2006.01)
*H02J 7/02* (2016.01)
*H02J 50/10* (2016.01)
*H05K 1/18* (2006.01)

(52) U.S. Cl.
CPC .......... *H02J 7/0042* (2013.01); *H02J 7/0047* (2013.01); *H02J 7/02* (2013.01); *H02J 50/10* (2016.02); *H05K 1/181* (2013.01); *H05K 2201/10113* (2013.01); *H05K 2201/10151* (2013.01)

(58) Field of Classification Search
CPC ............................ H02J 7/0042; H05K 1/181
USPC ......................................................... 320/108
See application file for complete search history.

(56) References Cited

U.S. PATENT DOCUMENTS

| | | | |
|---|---|---|---|
| 10,716,192 B1* | 7/2020 | Tsibulevskiy | H02J 7/025 |
| 2011/0056215 A1* | 3/2011 | Ham | H05B 6/1236 |
| | | | 62/3.7 |
| 2014/0292101 A1* | 10/2014 | Baarman | H05B 6/10 |
| | | | 307/104 |
| 2017/0042273 A1* | 2/2017 | Fletcher | A42B 3/20 |
| 2017/0285207 A1* | 10/2017 | Shao | H02J 50/80 |
| 2019/0006826 A1* | 1/2019 | Islinger | B60L 53/16 |
| 2020/0044482 A1* | 2/2020 | Partovi | G06F 1/1683 |
| 2020/0063614 A1* | 2/2020 | Dudar | F01M 5/001 |
| 2020/0076247 A1* | 3/2020 | Huang | H02J 50/80 |

\* cited by examiner

*Primary Examiner* — Suchin Parihar
(74) *Attorney, Agent, or Firm* — Birch, Stewart, Kolasch & Birch, LLP

(57) ABSTRACT

Disclosed is a wireless charger. The wireless charger includes a circuit board, a base and two transmitting coils. The circuit board is disposed in the base, a placement panel is disposed on the base, and two placement areas are disposed on the placement panel to carry two induction devices each provided with an induction coil or an induction metal. Two transmitting coils are disposed corresponding to the two placement areas in the base. Each transmitting coil is located below a respective one of the two placement area and electrically connected to the circuit board. The transmitting coil is capable of generating a magnetic field to enable electromagnetic induction with a respective one of the two induction devices so as to charge or heat the respective one of the two induction devices.

9 Claims, 3 Drawing Sheets

WIRELESS CHARGER

CROSS-REFERENCE TO RELATED APPLICATION

This application claims priority to a Chinese patent application No. 202020259403.9 filed on Mar. 5, 2020, disclosure of which is incorporated herein by reference in its entirety.

TECHNICAL FIELD

The present disclosure relates to a technical field of wireless charging and, in particular, to a wireless charger.

BACKGROUND

With the development of wireless induction technology, wireless charging has become a common charging mode for terminals such as mobile phones. Wireless charging is achieved through the principle of magnetic induction. When a current flows through a coil, the coil generates a magnetic field so that an induced electromotive force is generated to a coil near the magnetic field, thereby generating an induced current. Although this charging method has high conversion efficiency, there presents a short transmission distance within about 10 cm. In addition, this charging method has a high requirement on the placement of terminals such as mobile phones, which can only be charged one-to-one by coil alignment. In addition, metal induction contact may generate heat, resulting in heat generation and the like.

The working principle of a cup heating pad is that a coil in the cup heating pad enables electromagnetic induction with a metal coating on the bottom of a cup to transfer energy to the metal coating on the bottom of the cup, and then the metal coating transfers heat to water in the cup after its temperature rises.

However, in the related art, the wireless charger can only perform wireless charging, and the cup heating pad can only heat a cup. In this case, the wireless charger and the cup heating pad cannot be jointly used.

Therefore, a wireless charger is urgently needed to solve the above technical problem.

SUMMARY

The present disclosure provides a wireless charger capable of performing charging and heating simultaneously.

To achieve this, the present disclosure proposes technical solutions described below.

There is provided a wireless charger which includes a circuit board, a base and two transmitting coils. The circuit board is disposed in the base, a placement panel is disposed on the base, and two placement areas are provided on the placement panel to carry two induction devices each provided with an induction coil or an induction metal. Two transmitting coils are disposed corresponding to the two placement areas in the base. Each of the two transmitting coils is located below a respective one of the two placement areas and electrically connected to the circuit board. The each of the two transmitting coils is capable of generating a magnetic field to enable electromagnetic induction with a respective one of the two induction devices so as to charge or heat the respective one of the two induction devices.

Preferably, the wireless charger further includes two indicator lights electrically connected to the circuit board, and each of the two indicator lights indicates working states of a respective one of the two transmitting coils.

Preferably, the each of the two indicator lights is capable of emitting light of three colors.

Preferably, the wireless charger further includes two switches electrically connected to the circuit board. The two switches are provided in one-to-one correspondence with the two transmitting coils, and each of the two switches is configured to control working states of a respective one of the two transmitting coils.

Preferably, the wireless charger further includes a temperature sensor disposed on each of the two placement areas, and the temperature sensor is electrically connected to the circuit board and capable of detecting a temperature in the each of the two placement areas.

Preferably, the wireless charger further includes a weight sensor disposed on each of the two placement areas, and the weight sensor is capable of detecting a mass of an object placed on the each of the two placement areas.

Preferably, a foreign object detection sensor is disposed on each of the two placement areas.

Preferably, a plurality of rubber pads are provided on a bottom surface of the base.

Preferably, a non-slip mat is provided on each of the two placement areas.

The present disclosure has the beneficial effects below.

The wireless charger is provided with two placement areas on which two induction devices can be placed at the same time. Thus, the wireless charger can be used to charge or heat the two induction devices simultaneously or to charge one of the two induction devices and heat the other one. Heating and charging operations can be performed simultaneously so that the wireless charger can be used more widely. In addition, this function can be achieved only by adding a transmitting coil, and thus such wireless charger has a relatively simple structure and low manufacturing costs.

Figure 1:
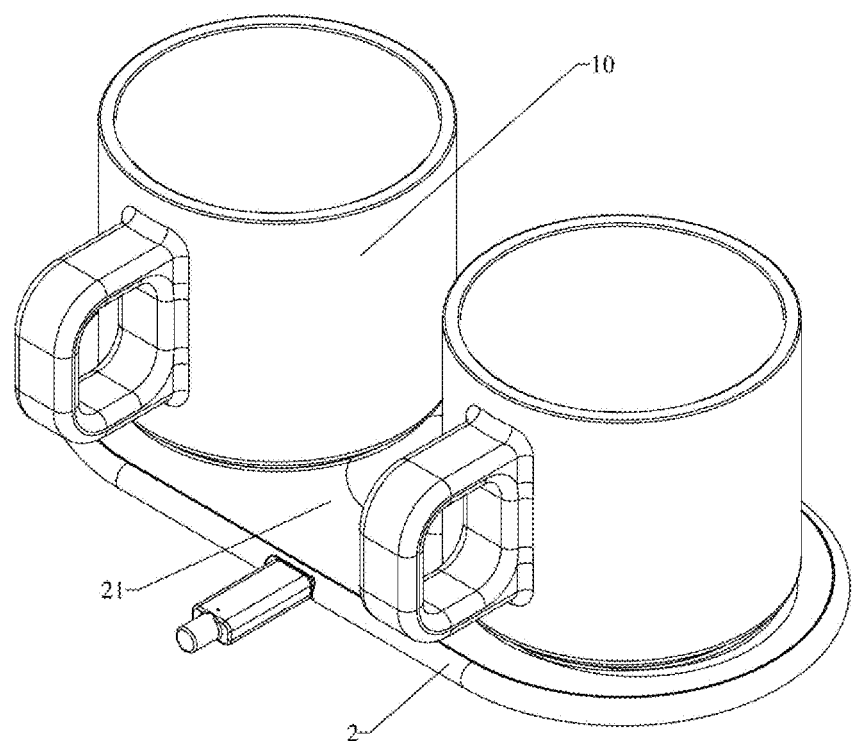
FIG. 1 is a first structure diagram of a wireless charger on which a cup is placed according to the present disclosure.

In the figures: 10-induction device; 1-circuit board; 2-base; 21-placement panel; 211-placement area; 22-rubber pad; 3-transmitting coil; 4-switch; 5-indicator light; and 6-non-slip mat

DETAILED DESCRIPTION

To make the objectives, technical solutions and advantages of embodiments of the present disclosure clearer, the technical solutions in the embodiments of the present disclosure will be described clearly and completely in combination with the drawings in the embodiments of the present disclosure. Apparently, the described embodiments are part (not all) of the embodiments of the present disclosure. Components of the embodiments of the present disclosure, generally described and illustrated in the drawings herein, may be configured and designed in various configurations.

Therefore, the detailed description of the embodiments of the present disclosure provided in the drawings below is not intended to limit the scope of the claimed disclosure, but merely to represent selected embodiments of the present disclosure. Based on the embodiments in the present disclosure, all other embodiments obtained by those of ordinary skill in the art without creative labor shall fall within the scope of the present disclosure.

It should be noted that similar reference numerals and letters indicate similar items in the drawings below. Thus, once an item is defined in one drawing, it need not be further defined and explained in the subsequent drawings.

In the description of the present disclosure, it should be noted that orientations or position relations indicated by terms "upper", "lower", "left", "right", "vertical", "horizontal", "in", "out" and the like are orientations or position relations based on the drawings, or orientations or position relations in which the product of the claimed disclosure is usually placed during use. These orientations or position relations are only for the convenience of describing the present disclosure and simplifying the description, and do not indicate or imply that a device or element referred to must have such specific orientations, or be configured or operated in such specific orientations. Thus, these orientations or position relations shall not be construed as limiting the present disclosure. In addition, terms "first", "second", "third" and the like are only used to distinguish descriptions, and shall not be construed as indicating or implying the relative importance. In the description of the present disclosure, unless otherwise stated, the meaning of "plurality" is two or more.

In the description of the present disclosure, it should also be noted that terms "disposed" and "connected" shall be understood in a broad sense unless otherwise expressly specified and limited. For example, the term "connected" may refer to "fixedly connected", "detachably connected" or "integrally connected". In addition, the term "connected" may also refer to "mechanically connected" or "electrically connected". For those of ordinary skill in the art, specific meanings of the above terms in the present disclosure may be understood according to specific situations.

In the present disclosure, unless otherwise explicitly stated and limited, a first feature "above" or "below" a second feature may include the first feature contacting with the second feature directly, and may also include the first feature contacting with the second feature indirectly by other feature therebetween. In addition, the first feature "above", "over" or "on" the second feature includes the first feature directly above or diagonally above the second feature, or only indicates the first feature higher in level than the second feature. The first feature "below", "underneath" or "under" the second feature includes the first feature directly below or diagonally below the second feature, or only indicates the first feature lower in level than the second feature.

Embodiments of the present disclosure will be described in detail below. Examples in the embodiments are illustrated in the drawings, where the same or similar reference numerals denote the same or similar elements, or elements having the same or similar functions throughout. The embodiments described below with reference to the drawings are exemplary and are only used to explain the present disclosure, but shall not be construed as limiting the present disclosure.

Figure 2:
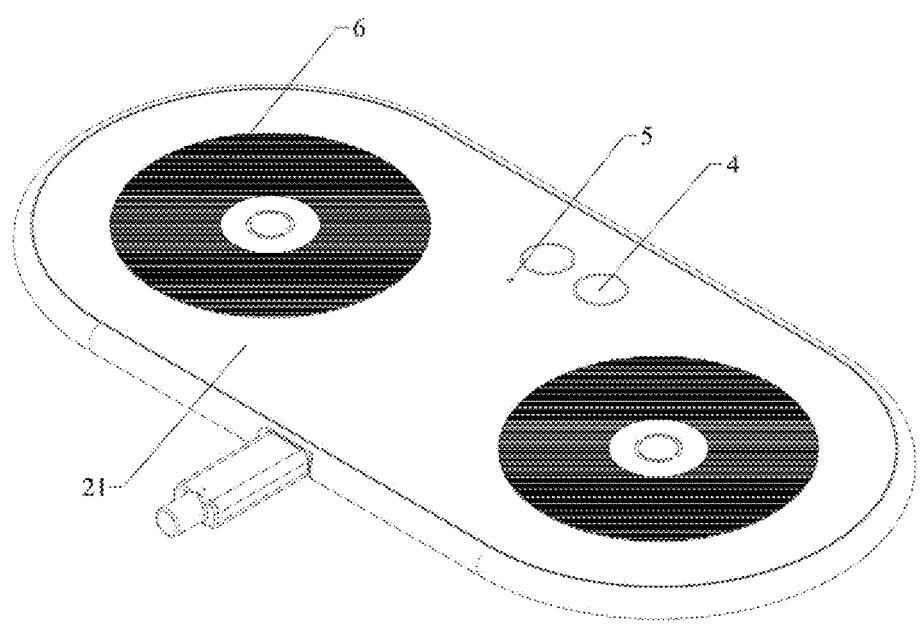
FIG. 2 is a second structure diagram of the wireless charger with a non-slip mat according to the present disclosure.
Figure 3:
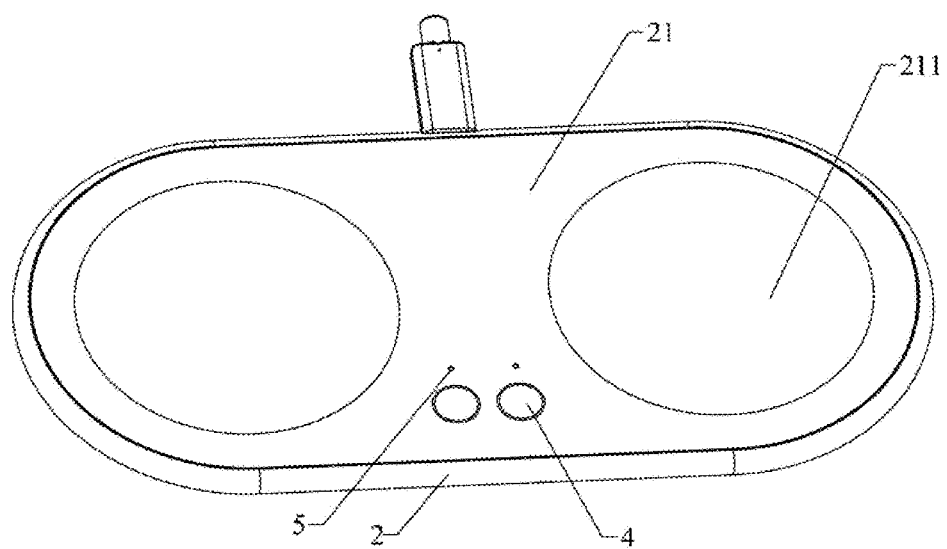
FIG. 3 is a third structure diagram of the wireless charger without a non-slip mat according to the present disclosure.
Figure 4:
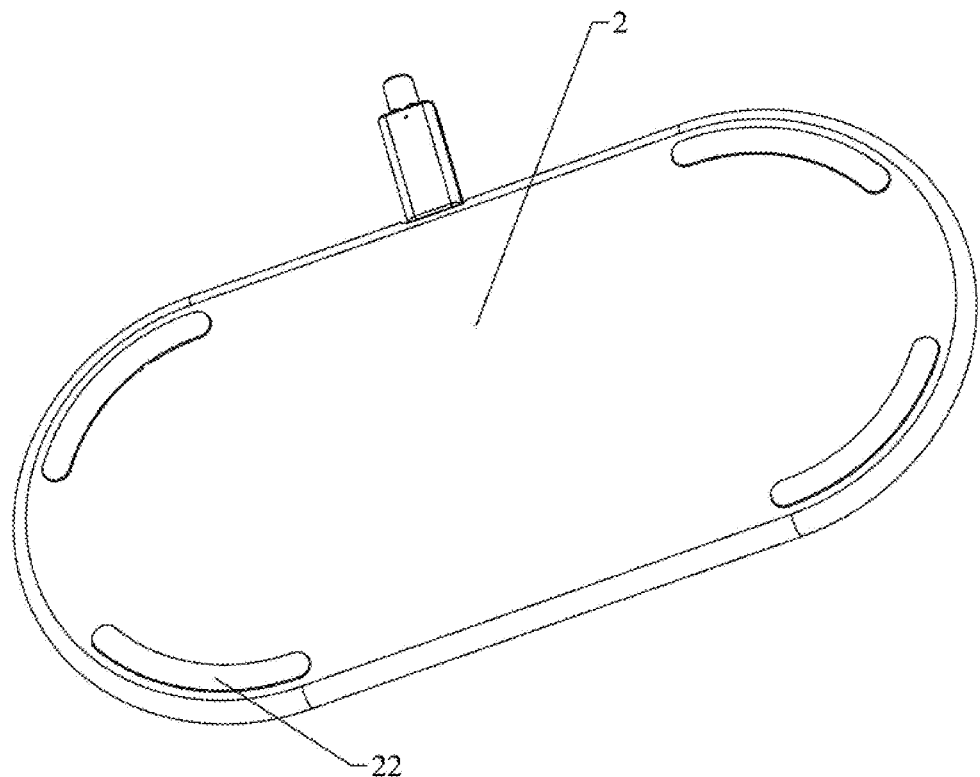
FIG. 4 is a fourth structure diagram of the wireless charger according to the present disclosure.
Figure 5:
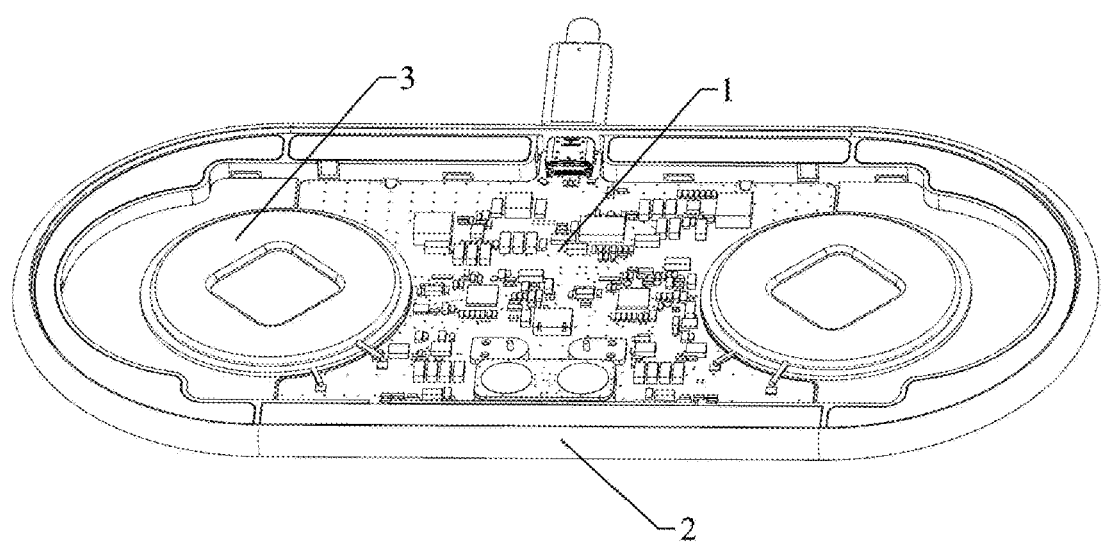
FIG. 5 is a partial structure diagram of the wireless charger according to the present disclosure.

As shown in FIGS. 1 to 5, the present embodiment discloses a wireless charger which includes a circuit board 1, a base 2, and two transmitting coils 3. The circuit board 1 is disposed in the base 2, a placement panel 21 is disposed on the base 2, and two placement areas 211 are provided on the placement panel 21. The two placement areas 211 are used to carry two induction devices 10, and each induction device 10 is provided with an induction coil or an induction metal. A non-slip mat 6 having a non-slip effect is provided on a surface of each placement area 211 so that the induction device 10 does not slip when placed on the non-slip mat 6, thereby preventing the induction device 10 from falling off by accident. The induction device 10 provided with the induction coil is a mobile terminal such as a mobile phone. The induction device 10 provided with the induction metal is a water cup, a coffee cup or the like, a cup body of which is made of a non-metal material such as ceramics or glass. Moreover, the induction metal is usually provided at the bottom of such induction device 10 to form a heater sheet. The heater sheet may be a metal coating, a metal plate, a metal film or the like, and is made of a metal including a magnetic conductor, a precious metal (such as gold, silver and platinum group metals), a rare earth mixed with plastic filler, or any combination thereof. The reason for providing the heater sheet is that the range of the induction field is limited, and the heating effect can be effectively ensured by providing such component.

Two transmitting coils 3 are disposed in the base 2 corresponding to the two placement areas 211. Each transmitting coils 3 is located below a respective one of the two placement areas 211 and electrically connected to the circuit board 1. Each transmitting coil 3 can generate a magnetic field to enable electromagnetic induction with a respective one of the two induction devices 10, thereby producing an induced electromotive force. If an induction coil is provided in the induction device 10, the induction coil may generate a current due to the induced electromotive force to charge the induction device 10. If an induction metal is provided in the induction device 10, the induction metal may generate heat due to the induced electromotive force to heat the induction device 10.

The wireless charger is provided with the two placement areas 211 on which can place two induction devices 10 at the same time. Thus, the wireless charger can be used to charge or heat the two induction devices 10 simultaneously or to charge one of the two induction devices 10 and heat the other one. Heating and charging operations can be performed simultaneously so that the wireless charger can be used more widely. In addition, this function can be achieved only by adding a transmitting coil, and thus such wireless charger has a relatively simple structure and low manufacturing costs.

Optionally, the wireless charger further includes two indicator lights 5 electrically connected to the circuit board 1. Each indicator light 5 can emit light of three colors to indicate states of a respective one of the two transmitting coils, such as heating, charging and detection of a foreign object. The three colors may be, but not limited to red, blue and green. Blue light indicates that heating of the induction device 10 is finished and the induction device 10 is in a heat preservation state. Green light indicates that charging is being performed. Red light indicates that the wireless charger has detected a foreign object and thus charging or heating function is suspended.

Optionally, the wireless charger further includes a temperature sensor disposed on each placement area 211. The temperature sensor is electrically connected to the circuit board 1 and capable of detecting a temperature in the placement area 211. During the charging process of the induction device 10, if the temperature sensor detects the temperature in the placement area 211 reaches a first preset value (which indicates the temperature is too high), the wireless charger will stop charging the induction device 10 to ensure the electrical safety, and charge it again after it cools. During the heating process of the induction device 10, if the temperature sensor detects the temperature reaches a second preset value (which indicates the heating task is completed), the wireless charger will stop heating or keep the induction device 10 warm.

Optionally, the wireless charger further includes a weight sensor disposed in each placement area 211. The weight sensor can detect whether an object is located on the placement area 211 and/or a mass of an object placed on the placement area 211. According to the mass of the detected object, it can be determined whether the detected object is an induction device 10, and what kind of induction device 10 it is.

A foreign object detection (FOD) sensor is provided in each placement area 211. The FOD sensor refers to a circuit module disposed in the wireless charger. A calculator or an IC component in the circuit module monitors and calculates relevant values before and during the working of the transmitting coil to obtain respective values of quality factor Q. A value of the quality factor Q is calculated by a formula $Q=\omega L/R$, where ω represents a working angular frequency, L represents an inductance value of the transmitting coil, and R represents a total resistance of the transmitting coil.

Before starting the power transmission, the calculator or IC component measures a value of the quality factor Q of the transmitting coil. This value of the quality factor Q is sent to a receiving end (induction device 10). An output threshold of the value of the quality factor Q of the transmitting coil is determined. Once the value of the quality factor Q of the transmitting coil is measured to be less than the output threshold during transmission, the output is terminated.

Operating instructions of the wireless charger are as below.

In a case where the power is not turned on, place an induction device 10 (mobile phone) on the placement area 211 so that the circuit module automatically recognizes whether the induction device 10 meets a wireless charging standard, and if the induction device 10 meets the wireless charging standard, the circuit module automatically activates the wireless charging function.

Heating or heat preservation function: turn on the wireless charger, manually switch to a heat preservation mode (the purpose of this operation is to turn off the FOD function to prevent the heating function from failing to start), and place an induction device 10 (cup) on the placement area 211 so that the wireless charger will perform heating.

In the charging mode, since the FOD function is always in a detection state, when one or more external metal objects approach, they may affect the value of the quality factor Q of the transmitting coil to be less than a rated output threshold. In this case, the charging is suspended, and after the one or more external metal objects are removed, the charging is automatically restored.

Optionally, the wireless charger further includes two switches 4, which are electrically connected to the circuit board 1. The two switches 4 are provided in one-to-one correspondence with the two transmitting coils 3, and each switch 4 is used to control working states of a respective one of the two transmitting coils 3. The wireless charger can be switched to the heat preservation mode by the switch 4 to heat the cup. In this embodiment, the switch 4 is preferably a manual switch, on which three gears (off gear, charging gear and heating gear) are provided. When the switch 4 is in the off gear, the transmitting coil 3 does not work. When the switch 4 is in the charging gear, the transmitting coil 3 can charge the induction device 10. When the switch 4 is in the heating gear, the transmitting coil 3 can heat the induction device 10. In other embodiments, the switch 4 may also be an automatic switch. According to the temperature sensor, the weight sensor, and the foreign object detection sensor, it is synthetically determined whether an object placed on the placement area 211 is an induction device 10, and what kind of induction device 10 it is. Then, the switch 4 is controlled to be switched to a corresponding gear.

A plurality of rubber pads 22 are provided on a bottom surface of the base 2. In this embodiment, four rubber pads 22 are provided on the base 2 to achieve the effect of support and slip resistance.

Apparently, the foregoing embodiments of the present disclosure are merely examples for clearly explaining the present disclosure, and are not intended to limit the embodiments of the present disclosure. For those of ordinary skill in the art, other different forms of changes or modifications can be made on the basis of the above description. There is no need and no way to enumerate all implementations. Any modification, equivalent substitution and improvement made within the spirit and principle of the present disclosure shall be included in the scope of the present disclosure.

What is claimed is:

1. A wireless charger with a circuit board, comprising:
   a base, the circuit board being disposed in the base, a placement panel being disposed on the base, and two placement areas being disposed on the placement panel to carry two induction devices each provided with an induction coil or an induction metal; and
   two transmitting coils disposed corresponding to the two placement areas in the base, each of the two transmitting coils being located below a respective one of the two placement areas and electrically connected to the circuit board, wherein the each of the two transmitting coils is capable of generating a magnetic field to enable electromagnetic induction with a respective one of the two induction devices so as to charge or heat the respective one of the two induction devices,
   wherein temperature sensors are disposed in the two placement areas respectively, and the temperature sensors are capable of detecting temperatures in the two placement areas respectively;
   wherein weight sensors are disposed in the two placement areas respectively, and the weight sensors are capable of detecting masses of objects placed on the two placement areas respectively;
   wherein foreign object detection sensors are disposed in the two placement areas respectively, and the foreign object detection sensors are capable of recognizing whether the two induction devices meet a wireless charging standard; and
   wherein the temperature sensors, the weight sensors and the foreign object detection sensors are used for synthetically determining whether an object placed on any one of the two placement areas is an induction device, and what kind of induction device an object placed on any one of the two placement areas is.

2. The wireless charger of claim 1, further comprising two indicator lights electrically connected to the circuit board, each of the two indicator lights indicating working states of a respective one of the two transmitting coils.

3. The wireless charger of claim 2, wherein the each of the two indicator lights is capable of emitting light of three colors.

4. The wireless charger of claim 1, further comprising two switches electrically connected to the circuit board, the two switches being provided in one-to-one correspondence with the two transmitting coils, and each of the two switches being configured to control working states of a respective one of the two transmitting coils.

5. The wireless charger of claim 1, wherein a plurality of rubber pads are disposed on a bottom surface of the base.

6. The wireless charger of claim 1, wherein a non-slip mat is disposed on each of the two placement areas.

7. The wireless charger of claim 1, wherein each of the foreign object detection sensors comprises a calculator configured to measure a value of quality factor of a corresponding one of the two transmitting coils, the each of the foreign object detection sensors is configured to recognize whether an induction device meets the wireless charging standard based on the value of quality factor.

8. The wireless charger of claim 7, wherein the each of the foreign objects is configured to activate wireless charging while the wireless charging standard is met, and configured to suspend wireless charging while the wireless charging standard is not met.

9. The wireless charger of claim 7, wherein the calculator is configured to perform a calculation of the value of quality factor by a formula $Q=\omega L/R$, where w represents a working angular frequency, L represents an inductance value of a transmitting coil, and R represents a total resistance of a transmitting coil.

* * * * *